United States Patent
Schmutz et al.

(10) Patent No.: US 7,134,825 B1
(45) Date of Patent: Nov. 14, 2006

(54) DEVICE FOR HANDLING SUBSTRATES INSIDE AND OUTSIDE A CLEAN ROOM

(75) Inventors: Wolfgang Schmutz, Zimmern (DE); Joseph Gentischer, Remshalden (DE)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/009,218

(22) PCT Filed: Apr. 13, 2000

(86) PCT No.: PCT/EO00/03324

§ 371 (c)(1),
(2), (4) Date: Feb. 5, 2002

(87) PCT Pub. No.: WO00/68976

PCT Pub. Date: Nov. 16, 2000

(30) Foreign Application Priority Data

May 8, 1999 (DE) ................................ 199 21 072

(51) Int. Cl.
*B65G 65/00* (2006.01)
(52) U.S. Cl. .................... 414/217.1; 414/937; 414/940
(58) Field of Classification Search ................ 414/939, 414/940, 271.1, 937
See application file for complete search history.

(56) References Cited

U.S. PATENT DOCUMENTS

| | | | |
|---|---|---|---|
| 5,217,501 A * | 6/1993 | Fuse et al. ................. | 29/25.01 |
| 5,388,944 A * | 2/1995 | Takanabe et al. ............ | 414/217 |
| 5,464,313 A * | 11/1995 | Ohsawa ....................... | 414/172 |
| 5,562,383 A * | 10/1996 | Iwai et al. ................ | 414/217.1 |
| 5,645,391 A * | 7/1997 | Ohsawa et al. ......... | 414/416.03 |
| 5,788,447 A | 8/1998 | Yonemitsu et al. ......... | 414/217 |
| 5,788,448 A * | 8/1998 | Wakamori et al. ..... | 414/222.02 |
| 6,052,913 A * | 4/2000 | Kaneko et al. ................ | 33/645 |
| 6,079,927 A * | 6/2000 | Muka ......................... | 414/217 |
| 6,131,307 A * | 10/2000 | Komino et al. ............... | 34/486 |

FOREIGN PATENT DOCUMENTS

| | | |
|---|---|---|
| WO | WO 99/02436 | 1/1999 |
| WO | WO 99/28951 | 6/1999 |

* cited by examiner

*Primary Examiner*—Thomas J Brahan
(74) *Attorney, Agent, or Firm*—Perman & Green, LLP; Richard Pickreign

(57) ABSTRACT

A device (10) for handling substrates (11) inside and outside a clean room (15) is provided with a locking transfer device (17), by which means a substrate cassette (12) that is accommodated in a box (13) in clean-room conditions can be removed from or placed in said box (13); and with a first handling device (51), by which means the substrates (11) can be placed in or removed from the cassette (12). According to the invention, a storage area (20) for a plurality of cassette boxes (13) is positioned on or above the clean room (15) and the locking transfer device (17) is provided between the storage area (20) and the clean room (15), so that various work and production steps can be combined in such a way as to save space.

13 Claims, 3 Drawing Sheets

DEVICE FOR HANDLING SUBSTRATES INSIDE AND OUTSIDE A CLEAN ROOM

This application claims the benefit of the earlier filed International Application No. PCT/EP00/03324, International Filing Date, Apr. 13, 2000, which designated the United States of America, and which international application was published under PCT Article 21(2) in German as WO Publication No. WO 00/68976.

DESCRIPTION

The present invention concerns a device for manipulating substrates inside and outside an ultraclean workroom.

In previously known devices of this type, the individual cassette boxes are introduced manually or automatically into the ultraclean workroom, whereupon the substrates are processed inside the ultraclean workroom; subsequently, the cassette boxes provided with the processed substrates are brought to another station arranged at a distance from the ultraclean workroom. The arrangement of various stations of such a device takes up a great deal of space and is both time-consuming and expensive due to the manipulating devices that are arranged between the stations.

The object of the present invention is to create a device for manipulating substrates inside and outside an ultraclean workroom of the type named initially, which can combine various work steps and production steps in a way that saves space.

In order to solve this problem an exemplary device is provided for manipulating substrates inside and outside an ultraclean workroom. The device comprises a sluice device provided between a storage room and ultraclean workroom by means of which a substrate cassette, accommodated under ultraclean room conditions in a box, can be removed from the box or reintroduced into this box. The device has a first manipulating device by means of which substrates can be placed and can be removed from a cassette. The storage room for a multiple number of cassette boxes is accommodated in a row and/or column arrangement.

Since the storage room is arranged above the otherwise unutilized space of the ultraclean workroom, a device for manipulating substrates inside and outside the ultraclean workroom is created in a way that saves space, and the most varied work steps can be joined together or combined. Since the paths between steps are short, this results in a considerable time savings.

Ideally, the substrate cassettes of any type of cassette boxes can be introduced into the ultraclean workroom, processed, or handled in another way, and again placed in the same arrangement or in a new arrangement relative to one another in a cassette box, and, for example, can be stored newly sorted.

Additional work steps and time-saving combinations of work steps are then possible, as will be described further below.

Advantageous embodiments of the locking units of the sluice device are produced by the exemplary features The sluice device having one or more locking units that are independent of one another, and that the sluice door of each locking unit (18) is formed by a component of the cassette box. The sluice device maybe arranged in the floor of storage room or of the ceiling of ultraclean workroom, and the sluice door may be formed by a platform of the cassette box Alternatively, the sluice device may be arranged in a side wall of ultraclean workroom, and the sluice door may be formed in a hood of the cassette box.

One or more listing mechanisms are provided for simple manipulation of the substrate cassettes or cassette boxes.

According to the exemplary features of the device the most varied work steps can be conducted individually or in combination, such as, for example, process steps, manufacturing steps, testing procedures, and sorting procedures, within the ultraclean workroom. New batches of substrates can also be combined in this way, according to the testing and/or sorting procedures and placed in the storage room. The first manipulation device embodied according to the features of claim 10 is of particular advantage for this purpose.

According to the exemplary features of the device, the storage room is provided with a plurality of storage spaces, which can be achieved by the second manipulation device together with one or more locking units and together with one or more input/output openings for the cassette boxes.

Additional individual features of the invention can be taken from the following description, in which the invention is described and explained in more detail on the basis of the examples of embodiment shown in the drawing. Here:

Figure 1:
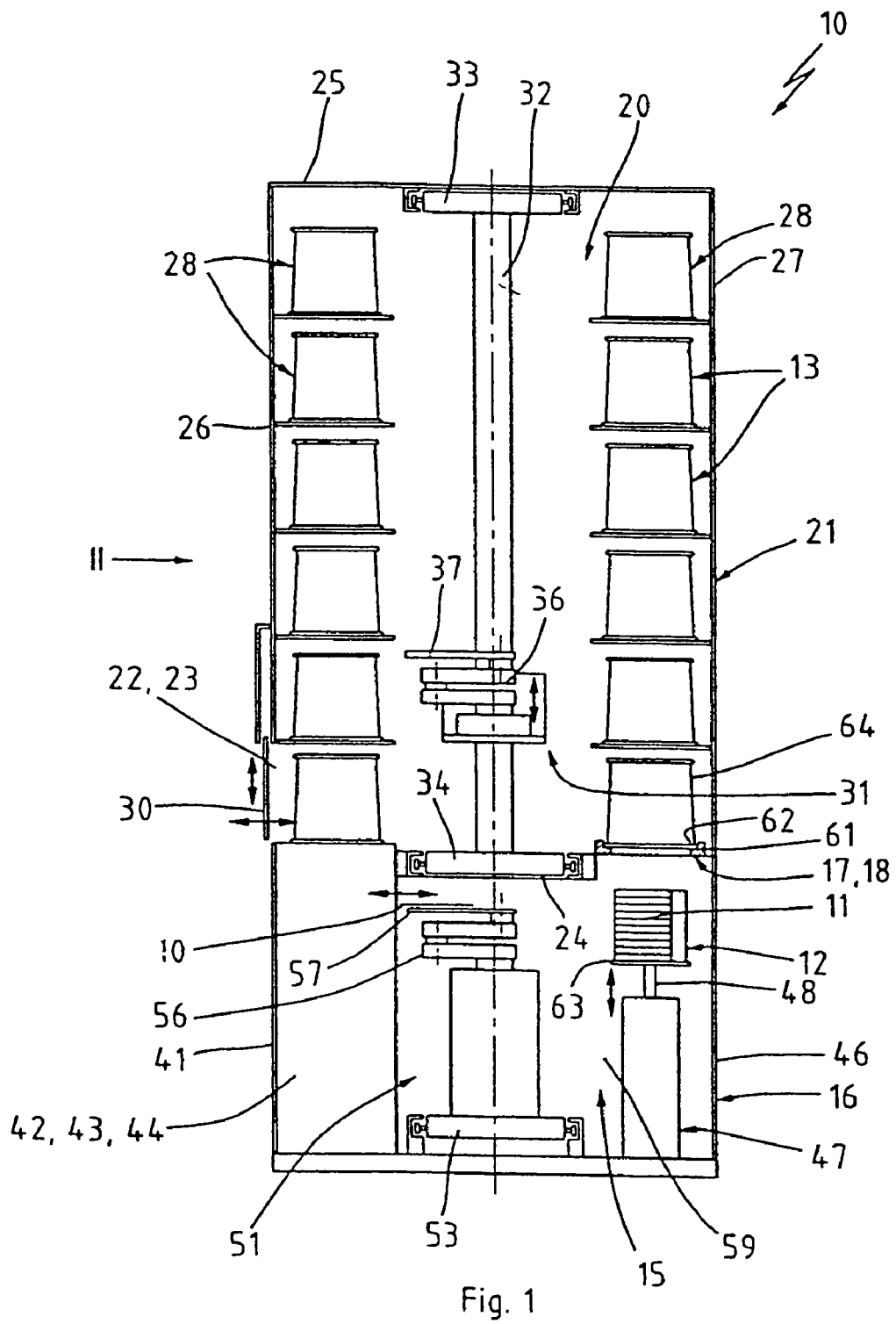
FIG. 1 shows in schematic cross-sectional representation a device for manipulating substrates inside and outside an ultraclean workroom according to a preferred example of embodiment of the present invention.
Figure 2:
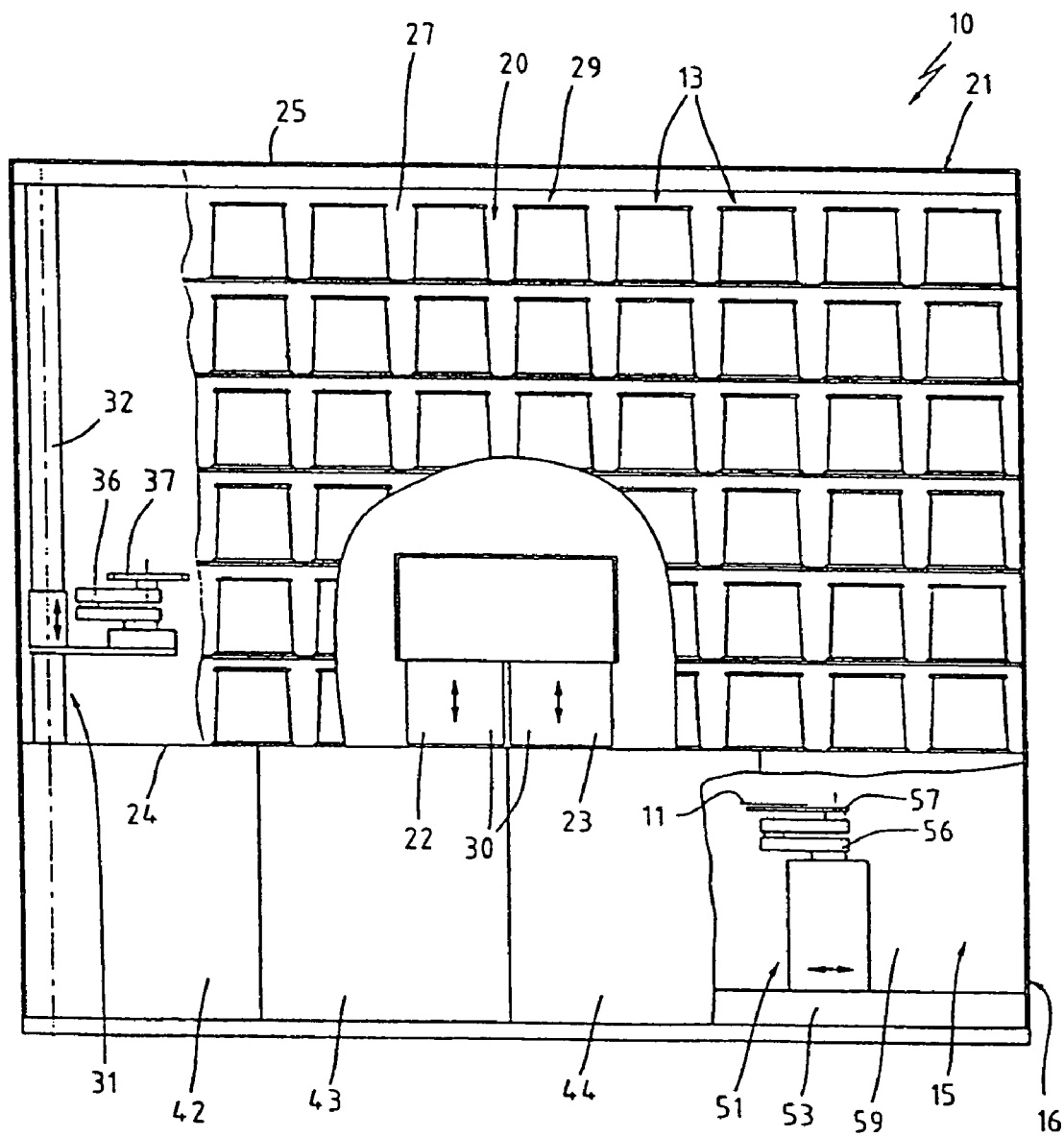
FIG. 2 shows a partially broken away lateral view according to arrow II of FIG. 1.

Device 10, which is shown in FIGS. 1 and 2 according to a preferred example of embodiment of the present invention, serves for manipulating substrates 11 inside and outside an ultraclean workroom 15, wherein substrates 11 are accommodated, stacked one on top of the other, in a cassette 12, and each cassette 12 is arranged inside a box 13 under ultraclean room conditions.

The ultraclean workroom 15 has a housing 16, which has a parallelepiped form, for example, and which is hermetically sealed, and a sluice device 17 with one or more locking units 18 (only one locking unit 18 is shown in FIG. 1 for example purposes). A housing 21 is placed on housing 16 of ultraclean workroom 15, and this housing 21 contains or bounds a storage room 20. The sluice device 17 effects a manipulation transfer between storage room 20 and ultraclean workroom 15, without exchange of atmosphere. Storage room 20 is provided with one or more input/output openings 22, 23, which can be closed by means of a door 30, for introducing or removing cassette boxes 13. In the example of embodiment shown, two input/output openings 22 and 23 arranged next to one another are provided in the vicinity of floor 24 of housing 21. It is understood that input/output openings 22, 23 can be present in greater number and/or can be provided at other places of housing 21, for example, in the vicinity of its ceiling 25. Among other things, this depends on whether input/output openings 22, 23 are operated manually or automatically by means of a loading device.

Housing 21 of storage room 20 is of parallelepiped shape in the example of embodiment shown and thus relatively high and configured such that rows and columns of storage spaces 28 are provided for cassette boxes 13 along both longitudinal sidewalls 26 and 27. A manipulating device 31 for cassette boxes 13 is provided between the two storage space arrangements 28 and 29. The manipulating device 31 has an upright column 32, which is guided longitudinally in floor 24 and in ceiling 25 of housing 21 by means of a linear guide 33, 34. A horizontally movable bent-arm fork 36, the fork ends 37 of which can grasp cassette boxes 13, for example, on top, is guided in the vertical direction at column 32. Manipulating device 31 can thus be moved in three coordinate axes, so that cassette boxes 13 can be moved from the one or more input/output openings 22, 23 to storage spaces 28, 29 and back, and between storage spaces 28, 29 and locking units 18 of sluice device 17.

Several chambers 42, 43, 44, for example, are arranged next to one another on one of the longitudinal sides 41 of housing 16 inside housing 16 for the ultraclean workroom 15. These chambers 42 to 44 may be used as process chambers, manufacturing chambers, testing chambers identification chambers and/or the like. It is understood that, independent of the representation shown in the drawing, any number of chambers may be provided. On opposite-lying longitudinal side 46 of housing 16 for ultraclean workroom 15, one or more lifting devices 47 is or are provided, which is or are arranged in the region of locking units 18 of sluice device 17 or below these units and one lifting device is assigned to one locking unit. Lifting device 47 possesses a rod 48 that can be moved up and down, by means of which a substrate cassette 12 can be moved up and down.

Between the arrangement of chambers 42 to 44 on one longitudinal side 46 and the arrangement of one or more lifting devices 47 on the other longitudinal side 46, a manipulating device 51 is provided, which can be moved back and forth in the longitudinal direction of housing 16 on a linear guide 53 of the floor side. In the example of embodiment shown, manipulating device 51 has a horizontally movable bent-arm gripper 56, and the gripper end 57 of this claw can transfer substrate 11 between substrate cassette 12 applied on lifting device 47, on the one hand, and one or more of chambers 42 to 44.

In the example of embodiment of FIGS. 1 and 2, the one or more locking units 18 of sluice device 17 is or are formed at floor 24 of housing 21, which here forms an intermediate wall or ceiling of housings 16 and 21, provided directly above the arrangement of the one or more lifting devices 47. The locking unit 18 has a rotating support 61, on which can be tightly seated the lower edge 62 of a hood 64 of each cassette box 13. For the sluice-type introduction of substrate cassette 12 into the ultraclean workroom 15, the bottom 63 of the cassette, which upon placement of the cassette box 13 on the locking unit 18 forms a door to the sluice device 17, is unlocked from hood 64 of cassette box 13, removed by rod 48 of lifting device 47, and cassette 12 is lowered to the level of manipulating device 51, so that substrates 11 of cassette 12 can be manipulated. If several lifting devices 47 are provided in the case of several locking units 48 and thus several substrate cassettes 12 are to be manipulated simultaneously or sequentially within the ultraclean workspace 15, the individual substrate cassettes 17 can be newly loaded in a different way, so that new batches can be made up. A substrate cassette 12 is put back into its cassette box 13 in the appropriate reverse manner by means of lifting device 47, whereupon after locking cassette bottom 63 with hood 64, cassette box 13 can be introduced by means of manipulating device 31 from locking unit 18 to a storage space 28, 29 or into input/output openings 22, 23.

Figure 3:
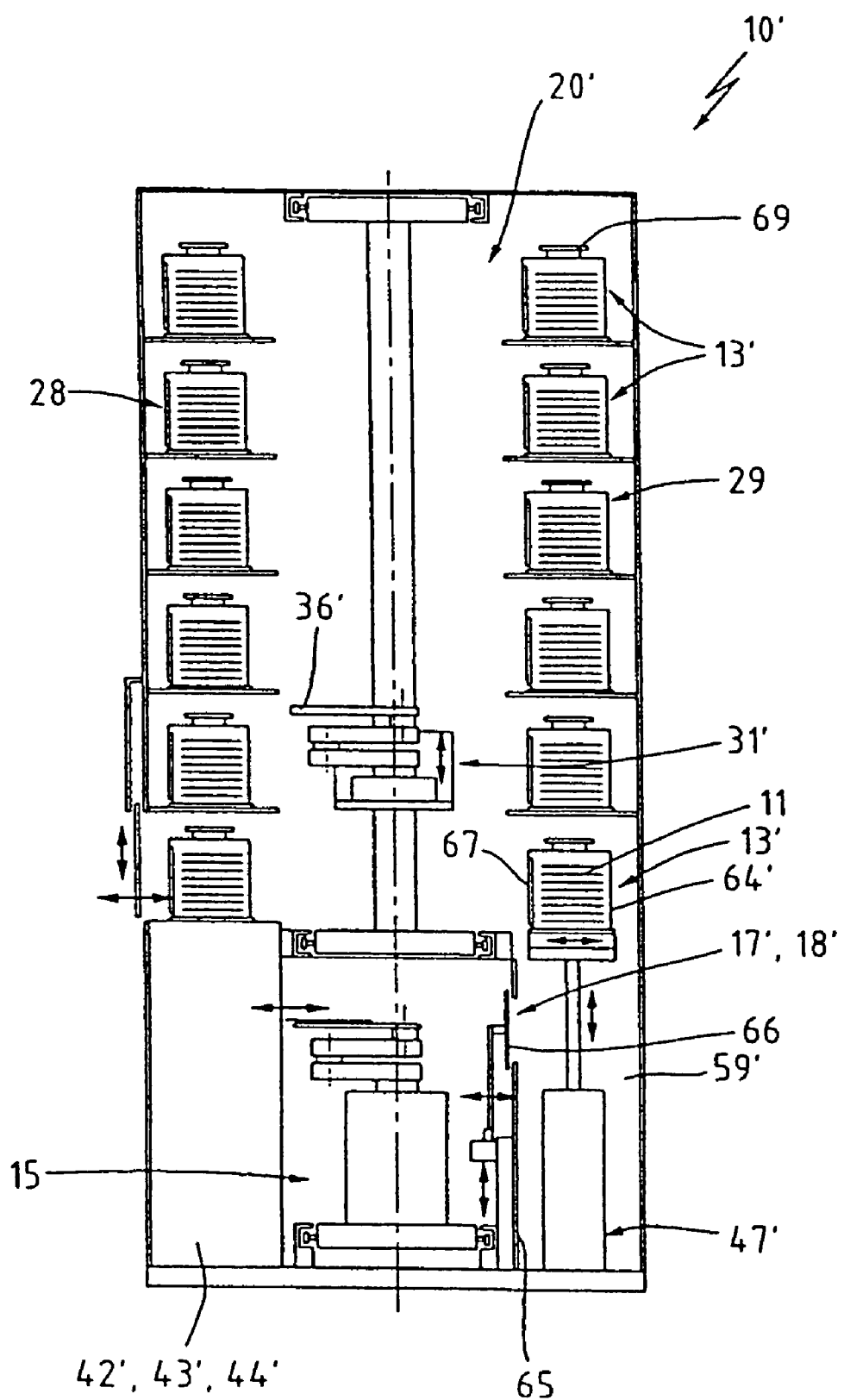
FIG. 3 shows a representation corresponding to FIG. 1, but according to another example of embodiment of the present invention.

In the example of embodiment of device 10' shown in FIG. 3, the site 59', at which the one or more lifting devices 47' is or are found, in fact, also in the vicinity of a longitudinal side of the housing, but still inside storage space 20', and thus outside ultraclean workroom 15, whose sidewall 65 displaced inwardly forms a part of sluice device 17' or of one or more locking units 18'. In this example of embodiment, a complete cassette box 13' is introduced onto lifting device 47' by means of manipulating device 31', and is lowered into the region of sidewall 65 or its locking unit 18' by means of the latter. Lifting device 47' is thus configured as a storage space 29 that can be lowered.

The same number of sluice doors 66 are found in side wall 65 as the number of locking units 18', and each of these doors opens together with a side door 67 in cassette box 13', if cassette box 13' is docked laterally at side wall 65 in a way that seals sluice door 66 opposite storage space 20'. After opening doors 66 and 67, substrates 11 can be removed from docked box 13' for manipulating in chambers 42' to 44' and are brought back again into the appropriate box 13'. It is understood that one or more of such lifting devices 47' can be arranged together with locking units 18' along this corridor 59' between the outer wall of the housing and side wall 65. In this example, box 13' cannot be opened via the bottom, but in a region of its hood 64', in order to remove substrates 11.

The other components of device 10' (FIG. 3) correspond to those of device 10 (FIGS. 1 and 2), whereby bent-arm fork 36' of manipulation device 31' is adapted to the design of box 13', whose hood 64' is provided with a handle 69 on top.

In this way, various steps of production, treatment, testing, classifying, identifying and including storage and new combinations of batches of substrates 11 inside a cassette 12, 12' can be achieved in a unitary device 10 or 10'.

The invention claimed is:

1. Device, for manipulating substrates (11) inside and outside an ultraclean workroom (15), with a storage room and a sluice device (17), the sluice device being provided between the storage room (20) and the ultraclean workroom (15), and providing means by which a substrate cassette (12) accommodated under ultraclean room conditions in a box can be accessed in the box under ultraclean room conditions, and with a first manipulating device (51) by means of which substrates (11) can be placed in the cassette (12) and can be removed from the cassette, is hereby characterized in that the storage room (20) is adapted for holding a multiple number of the boxes accommodated in row and/or column arrangement, and is extending over substantially the entire ultraclean workroom, and is further characterized in that a second manipulating device is located within the storage room and is operable to pick any of the boxes from any row or column of the row and/or column arrangement in the storage room without reaching across more than one row and without reaching across more than one column.

2. Device according to claim 1, further characterized in that the sluice device (17) is arranged in a floor (24) of the storage room (20) or in a ceiling of the ultraclean workroom (15).

3. Device according to claim 1, further characterized in that the sluice device (17) is arranged in an outer wall of the ultraclean workroom (15).

4. Device according to claim 1, further characterized in that ultraclean workroom (15) is provided with several working chambers (42 to 44), for processing substrates, each of which is served by, the first manipulating device (51).

5. Device according to claim 4, further characterized in that the first manipulating device at a floor of the ultraclean workroom is provided with a linear guide.

6. Device according to claim 1, further characterized in that the storage room (20) is provided with one or more input/output openings (22, 23) for cassette boxes (13).

7. Device according to claim 6, further characterized in that input/output openings (22, 23) can be closed.

8. Device according to claim 1, further characterized in that the first manipulating device is provided with a fork or gripper unit.

9. Device, for manipulating substrates (11) inside and outside an ultraclean workroom (15), with a storage room and a sluice device (17), the sluice device being provided between the storage room (20) and the ultraclean workroom (15), and providing means by which a substrate cassette (12) accommodated under ultraclean room conditions in a box can be removed from the box or reintroduced into the box, and with a first manipulating device (51) by means of which substrates (11) can be placed in the cassette (12) and can be removed from the cassette, is hereby characterized in that the storage room (20) is adapted for holding a multiple number of the boxes (13) accommodated in two substantially parallel arrays to define a transport corridor between the arrays, and is further characterized in that a footprint defined by outer walls of the ultraclean workroom is contained within a footprint defined by outer walls of the storage room, and a second manipulating device, with an articulated arm, is located within the transport corridor and is mounted for translation of the second manipulating device through the transport corridor in two directions angled relative to each other and substantially parallel to the arrays.

10. Device according to claim 9, further characterized in that the sluice device has more than one locking unit through which the substrate can be transported, the locking units being independent of one another, and wherein each locking unit has a sluice door, the sluice door being formed by a component (63, 67) of the box.

11. Device according to claim 10, further characterized in that the sluice door is formed by a platform (63) of the cassette box (13).

12. Device according to claim 9, further characterized in that the sluice device has more than one locking unit through which the substrate can be transported, the locking units being independent of one another, and wherein a lifting device (47) for a substrate cassette (12) or cassette box (13) is assigned to each locking unit (18).

13. Device according to claim 9, further characterized in that the second manipulating device (31) is provided on a bottom and/or a cover side with a linear guide (33, 34).

* * * * *